US012060636B2

(12) United States Patent
MacPherson et al.

(10) Patent No.: US 12,060,636 B2
(45) Date of Patent: Aug. 13, 2024

(54) METHOD FOR CONDITIONING A PLASMA PROCESSING CHAMBER

(71) Applicant: LAM RESEARCH CORPORATION, Fremont, CA (US)

(72) Inventors: Chiara Helena Catherina Giammanco MacPherson, Fremont, CA (US); Eric Pape, Campbell, CA (US)

(73) Assignee: Lam Research Corporation, Fremont, CA (US)

( * ) Notice: Subject to any disclaimer, the term of this patent is extended or adjusted under 35 U.S.C. 154(b) by 659 days.

(21) Appl. No.: 17/273,649

(22) PCT Filed: Sep. 16, 2019

(86) PCT No.: PCT/US2019/051318
§ 371 (c)(1),
(2) Date: Mar. 4, 2021

(87) PCT Pub. No.: WO2020/060929
PCT Pub. Date: Mar. 26, 2020

(65) Prior Publication Data
US 2021/0340668 A1 Nov. 4, 2021

Related U.S. Application Data

(60) Provisional application No. 62/734,844, filed on Sep. 21, 2018.

(51) Int. Cl.
*C23C 16/40* (2006.01)
*C23C 16/02* (2006.01)
(Continued)

(52) U.S. Cl.
CPC ........ *C23C 16/401* (2013.01); *C23C 16/0245* (2013.01); *C23C 16/4404* (2013.01);
(Continued)

(58) Field of Classification Search
CPC .................................................. C23C 16/4404
See application file for complete search history.

(56) References Cited

U.S. PATENT DOCUMENTS

2002/0005159 A1* 1/2002 Kitagawa .............. C23C 16/507
257/E21.101
2002/0045966 A1* 4/2002 Lee ..................... C23C 16/4401
700/121
(Continued)

FOREIGN PATENT DOCUMENTS

KR 10-0611610 8/2006
KR 2017-0059211 5/2017

OTHER PUBLICATIONS

International Search Report from International Application No. PCT/US2019/051318 dated Jan. 30, 2020.
(Continued)

*Primary Examiner* — Joseph A Miller, Jr.
(74) *Attorney, Agent, or Firm* — Beyer Law Group LLP

(57) ABSTRACT

A method for conditioning a plasma processing chamber including a chuck is provided. The method comprises a plurality of cycles, wherein each cycle comprises cleaning an interior of the plasma processing chamber and the chuck and forming a silicon oxide based coating on the interior of the plasma processing chamber and the chuck. The silicon oxide based coating has a first layer and a second layer.

4 Claims, 6 Drawing Sheets

(51) Int. Cl.
*C23C 16/44* (2006.01)
*C23C 16/455* (2006.01)
*H01L 21/02* (2006.01)
*H01L 21/683* (2006.01)

(52) U.S. Cl.
CPC .. *C23C 16/45557* (2013.01); *H01L 21/02046* (2013.01); *H01L 21/02315* (2013.01); *H01L 21/6833* (2013.01)

(56) References Cited

U.S. PATENT DOCUMENTS

| | | | |
|---|---|---|---|
| 2004/0023516 A1* | 2/2004 | Londergan | H01L 21/02189 |
| | | | 438/785 |
| 2004/0261815 A1 | 12/2004 | Pavone | |
| 2005/0079731 A1* | 4/2005 | Sharan | H01L 21/02274 |
| | | | 257/E21.546 |
| 2007/0155137 A1* | 7/2007 | Joshi | C23C 16/509 |
| | | | 438/478 |
| 2011/0045676 A1 | 2/2011 | Park et al. | |
| 2018/0114679 A1 | 4/2018 | Shah et al. | |

OTHER PUBLICATIONS

Written Opinion from International Application No. PCT/US2019/051318 dated Jan. 30, 2020.

* cited by examiner

METHOD FOR CONDITIONING A PLASMA PROCESSING CHAMBER

CROSS REFERENCE TO RELATED APPLICATION

This application claims the benefit of priority of U.S. Application No. 62/734,844, filed Sep. 21, 2018, which is incorporated herein by reference for all purposes.

BACKGROUND

Field

The disclosure relates to methods of forming semiconductor devices on a semiconductor wafer. More specifically, the disclosure relates to conditioning a chamber for the processing of substrates.

In forming semiconductor devices, plasma processing chambers may be used to process substrates. Residues are deposited within the plasma processing chambers. The residues may be removed between the processing of each substrate.

SUMMARY

To achieve the foregoing and in accordance with the purpose of the present disclosure, a method for conditioning a plasma processing chamber including a chuck is provided. The method comprises a plurality of cycles, wherein each cycle comprises cleaning an interior of the plasma processing chamber and the chuck and forming a silicon oxide based coating on the interior of the plasma processing chamber and the chuck. The silicon oxide based coating has a first layer and a second layer.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE EMBODIMENTS

The present disclosure will now be described in detail with reference to a few embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
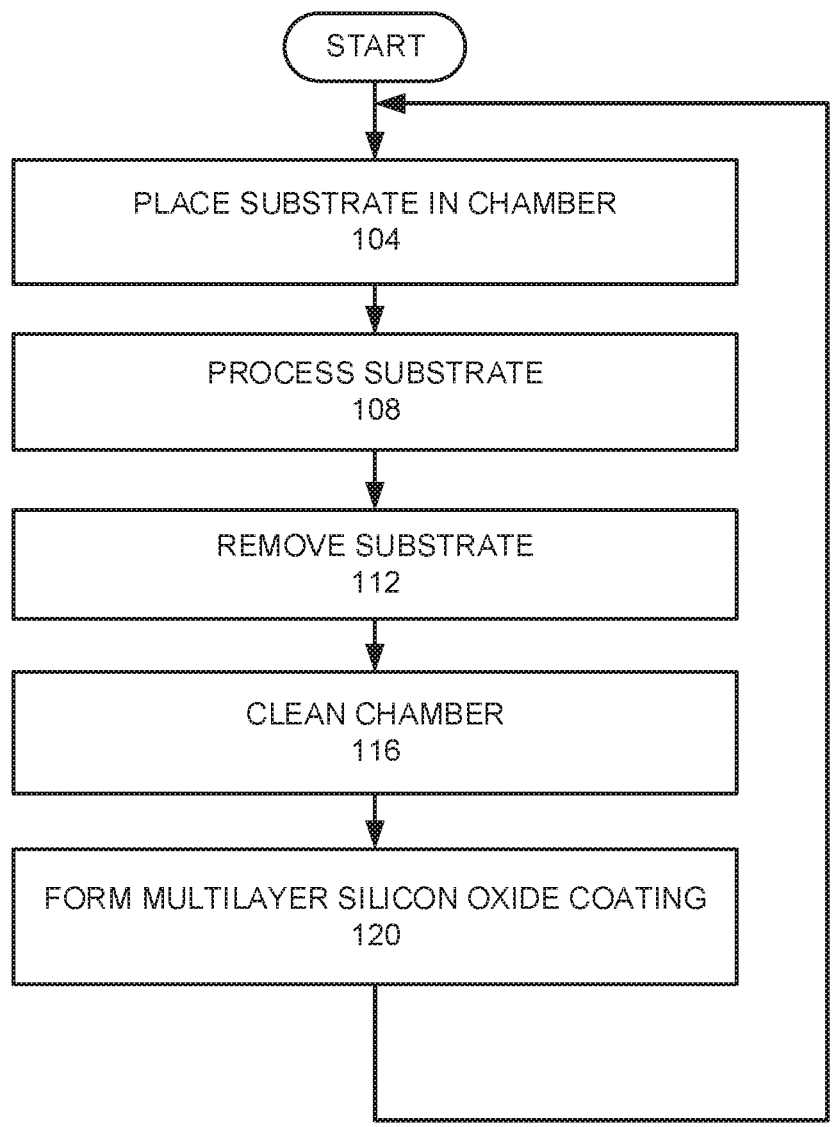
FIG. 1 is a high level flow chart of an embodiment.

FIG. 1 is a high level flow chart of an embodiment for processing substrates. In an exemplary embodiment, a substrate is placed in a plasma processing chamber (step 104). The substrate may be a silicon wafer. After the substrate has been placed into the plasma processing chamber, the substrate is processed (step 108). The process may be an etch process. The etch process may etch a dielectric or conductive layer. Such a process may provide an etch gas. The etch gas would be formed into a plasma. The plasma would etch a layer on the substrate or may etch the substrate. The etch process may produce etch products. The etch products may deposit as etch residues on the interior of the plasma processing chamber. In other embodiments, the process may be a deposition process. The deposition process may use deposition reactants that may deposit on the interior of the plasma processing chamber. The substrate is then removed from the plasma processing chamber (step 112).

The interior of the plasma processing chamber is cleaned (step 116). Since in this embodiment, the substrate has been removed (step 112) and a new substrate has not been placed in the plasma processing chamber, the cleaning process is a waferless cleaning. In some embodiments, the plasma processing may deposit nitrogen containing residues or other residues such as carbon based polymer residues on interior surfaces of the plasma processing chamber. If the residues are not cleaned from the inner surfaces of the plasma processing chamber, the residues may contaminate the next substrate to be processed. Therefore, before the next substrate is placed in the plasma processing chamber for processing, the plasma processing chamber is cleaned. In this embodiment, a cleaning gas is flowed into the plasma processing chamber (step 404). In this embodiment, to clean $SiO_x$, the cleaning gas comprises 30 sccm to 500 sccm of nitrogen trifluoride ($NF_3$), and 0 sccm to 200 sccm of argon (Ar). A plasma is generated from the cleaning gas. In this embodiment, this may be accomplished by providing an excitation radio frequency (RF) with a frequency of 13.6 megahertz (MHz) at 2000 watts. In an embodiment, to clean carbon, the cleaning gas comprises 40-200 sccm oxygen ($O_2$). A plasma is generated from the cleaning as by providing an excitation RF at a frequency of 13.6 MHz at 1000 watts. In this embodiment, a bias with a magnitude of 0 volts to 400 volts is provided by providing an RF with a frequency of 400 kilohertz (kHz) to 13.6 megaHertz (MHz) at 0 kilowatts (kW) to 1 kW. The cleaning process is then stopped.

Figure 2:
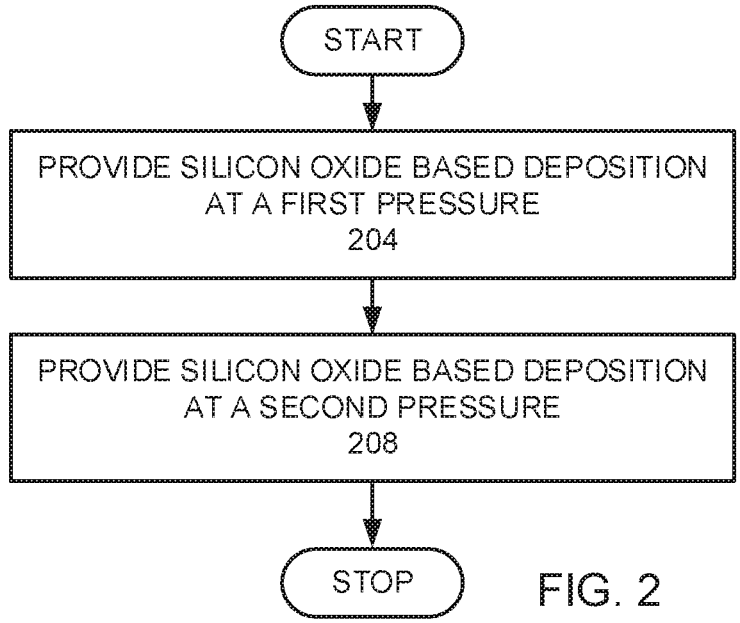
FIG. 2 is a more detailed flow chart of a step of forming a multilayer silicon oxide based coating used in an embodiment.

A multilayer silicon oxide ($SiO_2$) based coating is formed on the interior of the plasma processing chamber (step 120). FIG. 2 is a more detailed flow chart of the step of forming a multilayer silicon oxide based coating used in an embodiment. The multilayer silicon oxide based coating includes a first silicon oxide based layer and a second silicon oxide based layer. A first silicon oxide based deposition process is provided at a first pressure (step 204) to form the first silicon oxide based layer. In this example, the first silicon oxide based deposition process flows a deposition gas of 100 sccm silicon tetrachloride ($SiCl_4$), 200 sccm $O_2$, and 300 sccm Ar. The deposition gas is transformed into a plasma by providing 1000 watts of transformer coupled plasma (TCP) power at 13.6 MHz. A transformer coupled capacitive tuning (TCCT) match of 1 is provided. A chamber pressure of 50 mTorr is provided.

A second silicon oxide based deposition process is then provided at the second pressure (step 208) to form a second silicon oxide based layer. In this example, the second silicon oxide based deposition process flows a deposition gas of 100 sccm $SiCl_4$, 200 sccm $O_2$, and 300 sccm Ar. The deposition gas is transformed into a plasma by providing 1000 watts of TCP power at 13.6 MHz. A transformer coupled capacitive tuning (TCCT) match of 1 is provided. A chamber pressure of 10 mTorr is provided. In various embodiments, the first pressure is greater than a first threshold pressure of 20 mTorr and the second pressure is less than a second threshold pressure of 20 mTorr. In other embodiments, the first pressure is greater than a first threshold pressure of 40 mTorr and the second pressure is less than a second threshold pressure of 20 mTorr.

The cleaning of the plasma processing chamber (step 116) removes contaminants deposited during substrate processing (step 108). The forming of the multilayer silicon oxide based coating (step 120) coats the interior of the plasma processing chamber and the chuck to further neutralize any contaminants within the plasma processing chamber. After the multilayer silicon oxide based coating is formed (step 120), the process returns to the step of placing another substrate in the plasma processing chamber (step 104), and the cycle is repeated. The foregoing cycle is repeated multiple times as needed or desired.

The first silicon oxide based layer has a higher density than the density of the second silicon oxide based layer. The densities of the two silicon oxide based layers may be tuned to minimize contamination and provide improved dechucking of a substrate. Coatings in the prior art that have been optimized to reduce contaminants have been found to have dechucking problems. Such dechucking problems are caused by substrates sticking to a chuck. The sticking makes removal of the substrate more difficult. By forming the first silicon oxide based layer using a first pressure (step 204) and the second silicon oxide based layer using a second pressure (step 208), the first and second pressures may be set to optimize both the reduction of contamination and ease of dechucking. A silicon oxide based deposition at a lower pressure provides a thicker deposition per unit time. The silicon oxide based deposition process at a lower pressure provides a deposition that is more likely to flake off, creating particle problems. The silicon oxide based deposition process at a higher pressure provides a thinner deposition that has unterminated or dangling bonds. The unterminated bonds can stick to the substrate.

Figure 3:
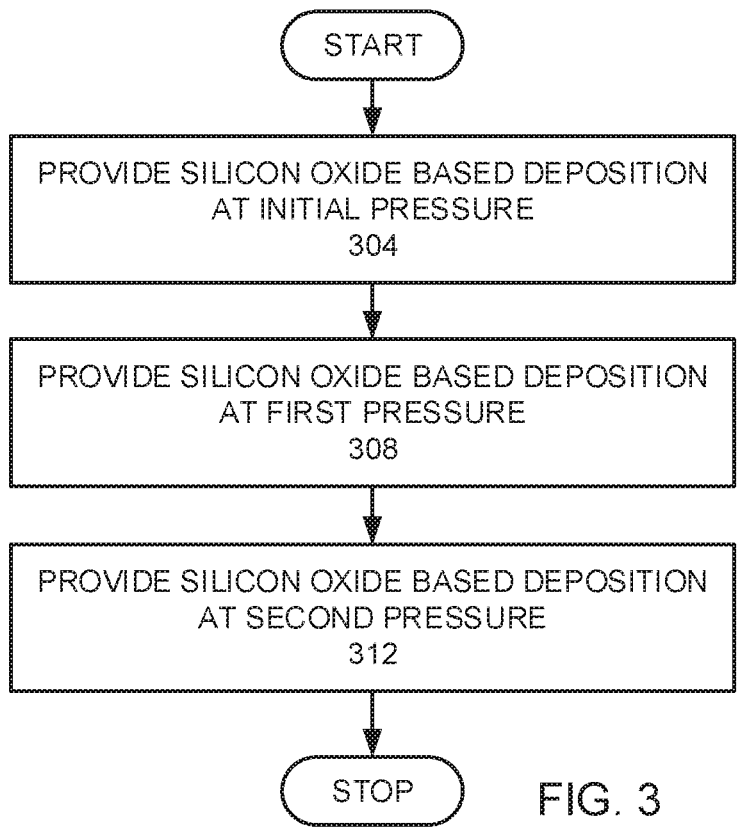
FIG. 3 is a more detailed flow chart of a step of forming a multilayer silicon oxide based coating used in another embodiment.

FIG. 3 is a more detailed flow chart of the step of forming a multilayer silicon oxide based coating (step 120) of another embodiment. An initial silicon oxide based deposition process is provided at an initial pressure (step 304) to form an initial silicon oxide based layer. In this example, the initial silicon oxide based deposition process flows a deposition gas of 100 sccm $SiCl_4$, 200 sccm $O_2$, and 300 sccm Ar. The deposition gas is transformed into a plasma by providing 1000 watts of TCP power at 13.6 MHz. A transformer coupled capacitive tuning (TCCT) match of 1 is provided. A chamber pressure of 10 mTorr is provided. In this embodiment, the initial silicon oxide based deposition process at a lower pressure provides improved adhesion and a thicker deposition.

A first silicon oxide based deposition process is then provided at a first pressure (step 308) to form a first silicon oxide based layer. In this example, the first silicon oxide based deposition process flows a deposition gas of 100 sccm $SiCl_4$, 200 sccm $O_2$, and 300 sccm Ar. The deposition gas is transformed into a plasma by providing 1000 watts of TCP power at 13.6 MHz. A transformer coupled capacitive tuning (TCCT) match of 1 is provided. A chamber pressure of 50 mTorr is provided. The first silicon oxide based layer at a higher pressure provides a thinner layer that is less likely to flake. The first silicon oxide based layer tends to stick to the substrate.

A second silicon oxide based deposition process is then provided at a second pressure (step 312) to form a second silicon oxide based layer. In this example, the second silicon oxide based deposition process flows a deposition gas of 100 sccm $SiCl_4$, 200 sccm $O_2$, and 300 sccm Ar. The deposition gas is transformed into a plasma by providing 1000 watts of TCP power at 13.6 MHz. A transformer coupled capacitive tuning (TCCT) match of 1 is provided. A chamber pressure of 10 mTorr is provided. In various embodiments, the initial pressure is less than 20 mTorr, the first pressure is greater than 20 mTorr, and the second pressure is less than 20 mTorr. In other embodiments the first pressure is greater than 40 mTorr and the initial pressure and second pressure are less than 20 mTorr. The second silicon oxide based layer at a lower pressure is deposited to reduce sticking of the deposited layer to the substrate.

Figure 4:
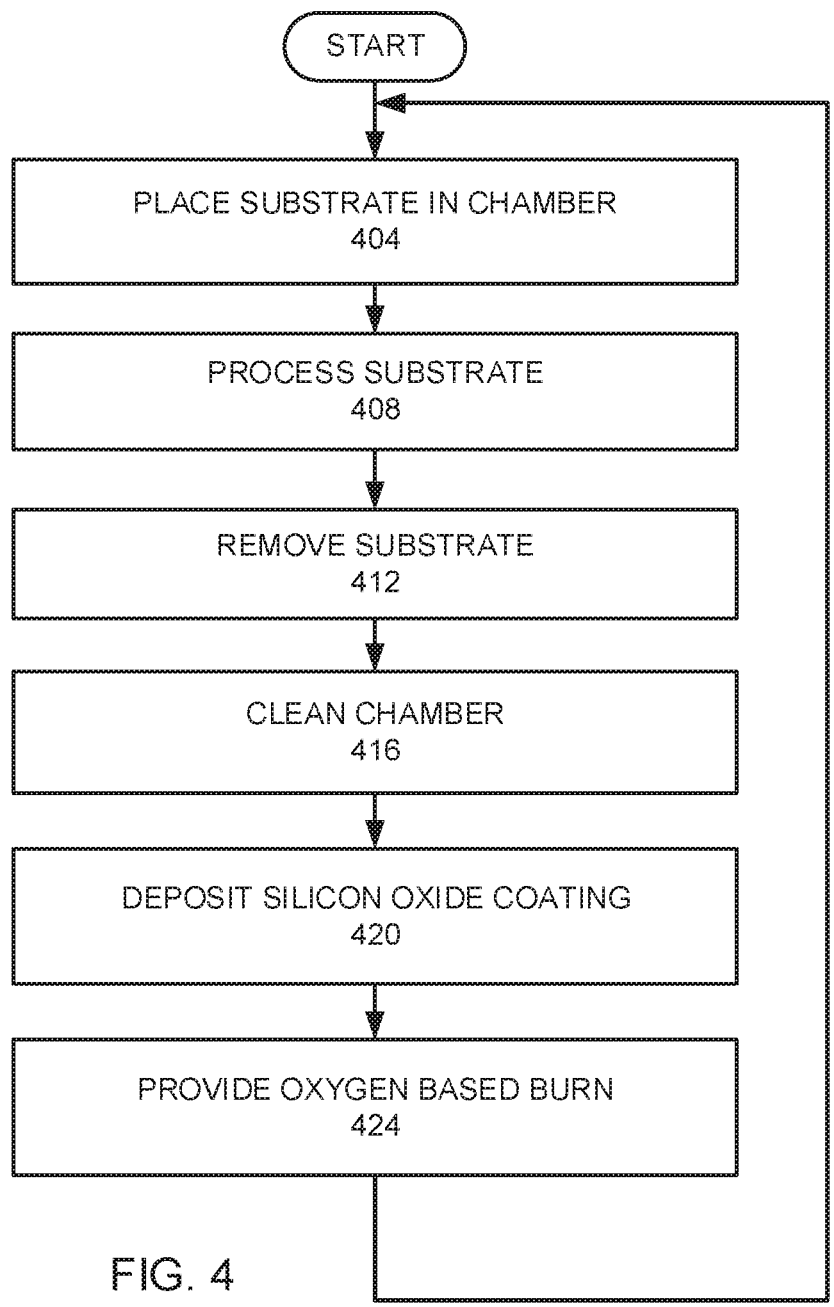
FIG. 4 is a high level flow chart of another embodiment.

FIG. 4 is a high level flow chart of another embodiment. In an exemplary embodiment, a substrate is placed in a plasma processing chamber (step 404). The substrate may be a silicon wafer. After the substrate has been placed into the plasma processing chamber, the substrate is processed (step 408). The process may be an etch process or a deposition process. After the substrate is processed, the substrate is then removed from the plasma processing chamber (step 412).

Next, the plasma processing chamber is cleaned (step 416). In some embodiments, the plasma processing may deposit residues on surfaces of the plasma processing chamber. In this embodiment, a cleaning gas is flowed into the plasma processing chamber. In this embodiment, to clean $SiO_x$, the cleaning gas comprises 30 sccm to 700 sccm of $NF_3$, and 0 sccm to 300 sccm of Ar. A plasma is generated from the cleaning gas. In this embodiment, an excitation RF with a frequency of 13.6 MHz at 2000 watts is provided. In another embodiment, to clean carbon, the cleaning gas comprises 40-200 sccm $O_2$. A plasma is generated from the cleaning gas by providing an excitation RF at a frequency of 13.6 MHz at 1000 watts. In this embodiment, a bias with a magnitude of 0 volts to 400 volts is provided by providing an RF with a frequency of 400 kHz to 13.6 MHz at 0 kW to 1 kW. The cleaning process is then stopped. The cleaning of the plasma processing chamber (step 416) removes contaminants deposited by the processing of the substrate (step 408). An oxygen burn during the cleaning (step 416) removes any deposition or contamination from processing the substrate (step 408). A $NF_3$ burn during the cleaning (step 416) removes remaining deposited silicon oxide that has survived the processing the substrate (step 408).

A $SiO_2$ based coating is deposited on the interior of the plasma processing chamber (step 420). In this example, the silicon oxide based deposition process flows a deposition gas of 100 sccm $SiCl_4$, 200 sccm $O_2$, and 300 sccm Ar. The deposition gas is transformed into a plasma by providing 1000 watts of TCP power at 13.6 MHz. A transformer coupled capacitive tuning (TCCT) match of 1 is provided. A chamber pressure of 50 mTorr is provided. In various embodiments, the chamber pressure is at least 40 mTorr. The silicon oxide based coating provides a consistent chamber condition for each incoming wafer. Providing the silicon oxide based coating (step 420) eliminates or minimizes first wafer effects and chamber seasoning issues. Providing the silicon oxide based coating (step 420) also protects the chamber components thereby extending their lifetime. Otherwise, chamber components may be etched by the plasma and have a correspondingly shorter life. Providing the silicon oxide based coating (step 420) further reduces or avoids contamination from chamber components that might be etched. The silicon oxide based coating (step 420), after the plasma process chamber cleaning (step 416), is deposited on a clean chamber surface and with a reliable thickness and consistency.

An oxygen based burn of the silicon oxide based coating is provided (step 424). In this example, the oxygen based burn flows a burn gas of 200 sccm $O_2$ and 300 sccm Ar. The burn gas is transformed into a plasma by providing 1000 watts of TCP power at 13.6 MHz. A chamber pressure of 50 mTorr is provided. The deposition of the silicon oxide based coating (step 420) coats the interior of the plasma processing chamber and the chuck to further neutralize any contaminants within the plasma processing chamber during the next cycle of substrate processing. The silicon oxide based coating (step 420) and the oxygen based burning (step 424) minimize contamination and provide improved dechucking of a substrate.

The oxygen based burn (step 424) causes any dangling or unterminated bonds on the deposited silicon oxide based coating to form connections to form terminated bonds, thereby preventing any dangling bonds from sticking to the backside of the substrate. In various embodiments, the bias during the oxygen based burn (step 424) is less than 400 volts. For example, the bias is equal to 0 volts. The process returns to the step of placing another substrate in the plasma processing chamber (step 404), and the cycle is repeated multiple times as needed or desired. The oxygen based burn (step 424) modifies the coating surface for greater uniformity and improved performance. The oxygen based burn (step 424) may also remove loosely bound clumps of silicon oxide. As result, the silicon oxide based coating has a first layer of the silicon oxide based coating not changed by the oxygen burn and a second layer of the silicon oxide based coating changed by the oxygen burn. In addition, the oxygen burn makes the second layer a more robust or tougher layer.

Figure 5:
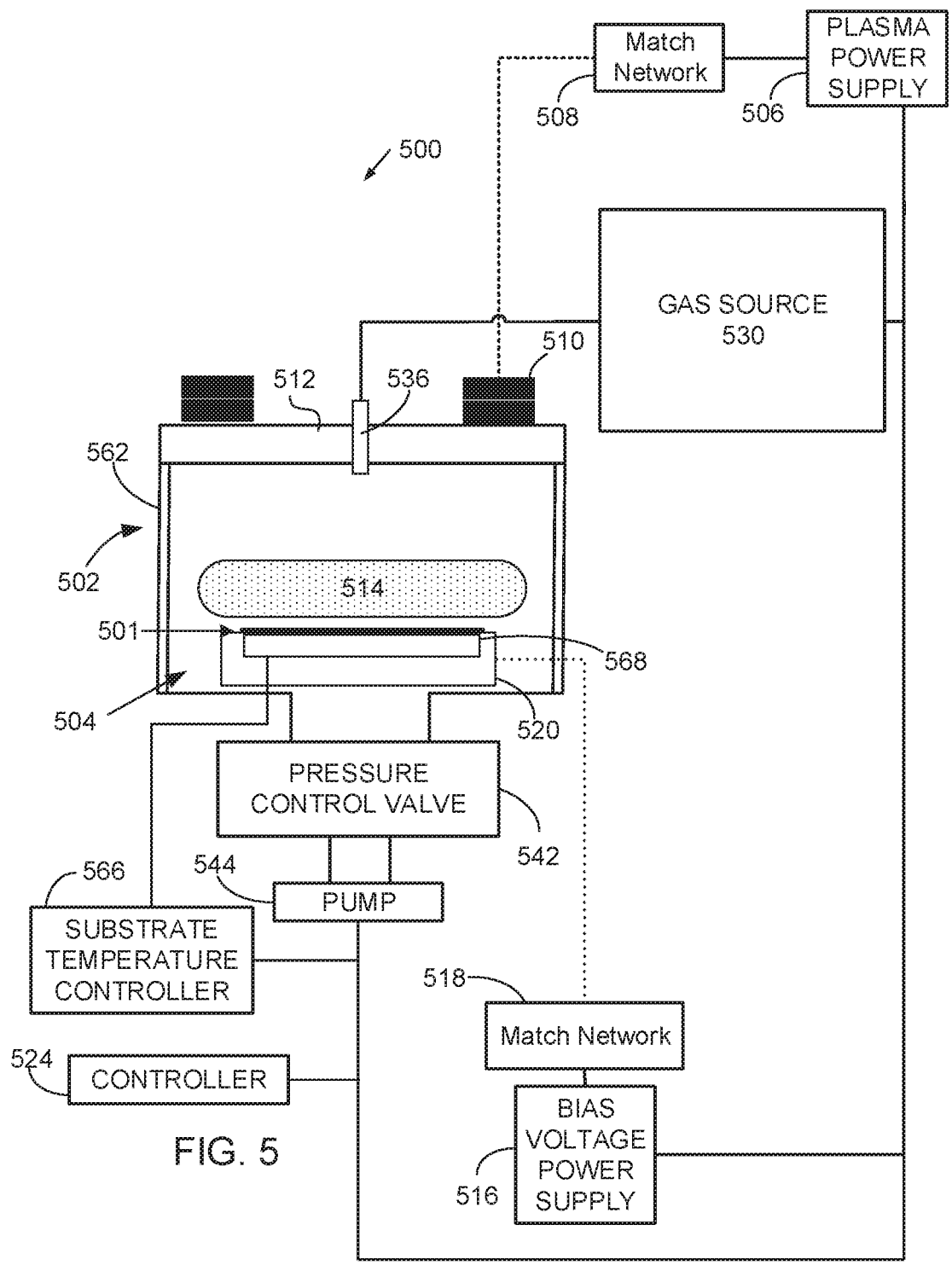
FIG. 5 is a schematic view of a etch chamber that may be used in an embodiment.

FIG. 5 schematically illustrates an example of a plasma processing system 500. The plasma processing system 500 may be used to process a substrate 501 in accordance with one embodiment. The plasma processing system 500 includes a plasma reactor 502 having a plasma processing chamber 504, enclosed by a chamber wall 562. A plasma power supply 506, tuned by a match network 508, supplies power to a TCP coil 510 located near a power window 512 to create a plasma 514 in the plasma processing chamber 504 by providing an inductively coupled power. The TCP coil (upper power source) 510 may be configured to produce a uniform diffusion profile within the plasma processing chamber 504. For example, the TCP coil 510 may be configured to generate a toroidal power distribution in the plasma 514. The power window 512 is provided to separate the TCP coil 510 from the plasma processing chamber 504 while allowing energy to pass from the TCP coil 510 to the plasma processing chamber 504. A wafer bias voltage power supply 516 tuned by a match network 518 provides power to an electrode 520 to set the bias voltage on the substrate 501. The electrode 520 provides a chuck for the substrate 501, where the electrode 520 acts as an electrostatic chuck. A substrate temperature controller 566 is controllably connected to a Peltier heater/cooler 568. A controller 524 sets points for the plasma power supply 506, the substrate temperature controller 566, and the wafer bias voltage power supply 516.

The plasma power supply 506 and the wafer bias voltage power supply 516 may be configured to operate at specific radio frequencies such as, 13.56 MHz, 27 MHz, 2 MHz, 1 MHz, 400 kHz, or combinations thereof. Plasma power supply 506 and wafer bias voltage power supply 516 may be appropriately sized to supply a range of powers in order to achieve desired process performance. For example, in one embodiment, the plasma power supply 506 may supply the power in a range of 50 to 5000 Watts, and the wafer bias voltage power supply 516 may supply a bias voltage in a range of 20 to 2000 V. In addition, the TCP coil 510 and/or the electrode 520 may be comprised of two or more sub-coils or sub-electrodes. The two or more sub-coils or sub-electrodes may be powered by a single power supply or powered by multiple power supplies.

As shown in FIG. 5, the plasma processing system 500 further includes a gas source 530. The gas source 530 provides gas or remote plasma to a feed 536 in the form of a nozzle. The process gases and byproducts are removed from the plasma processing chamber 504 via a pressure control valve 542 and a pump 544. The pressure control valve 542 and the pump 544 also serve to maintain a particular pressure within the plasma processing chamber 504. The gas source 530 is controlled by the controller 524. A Kiyo® by Lam Research Corp. of Fremont, Calif., may be used to practice an embodiment.

Figure 6:
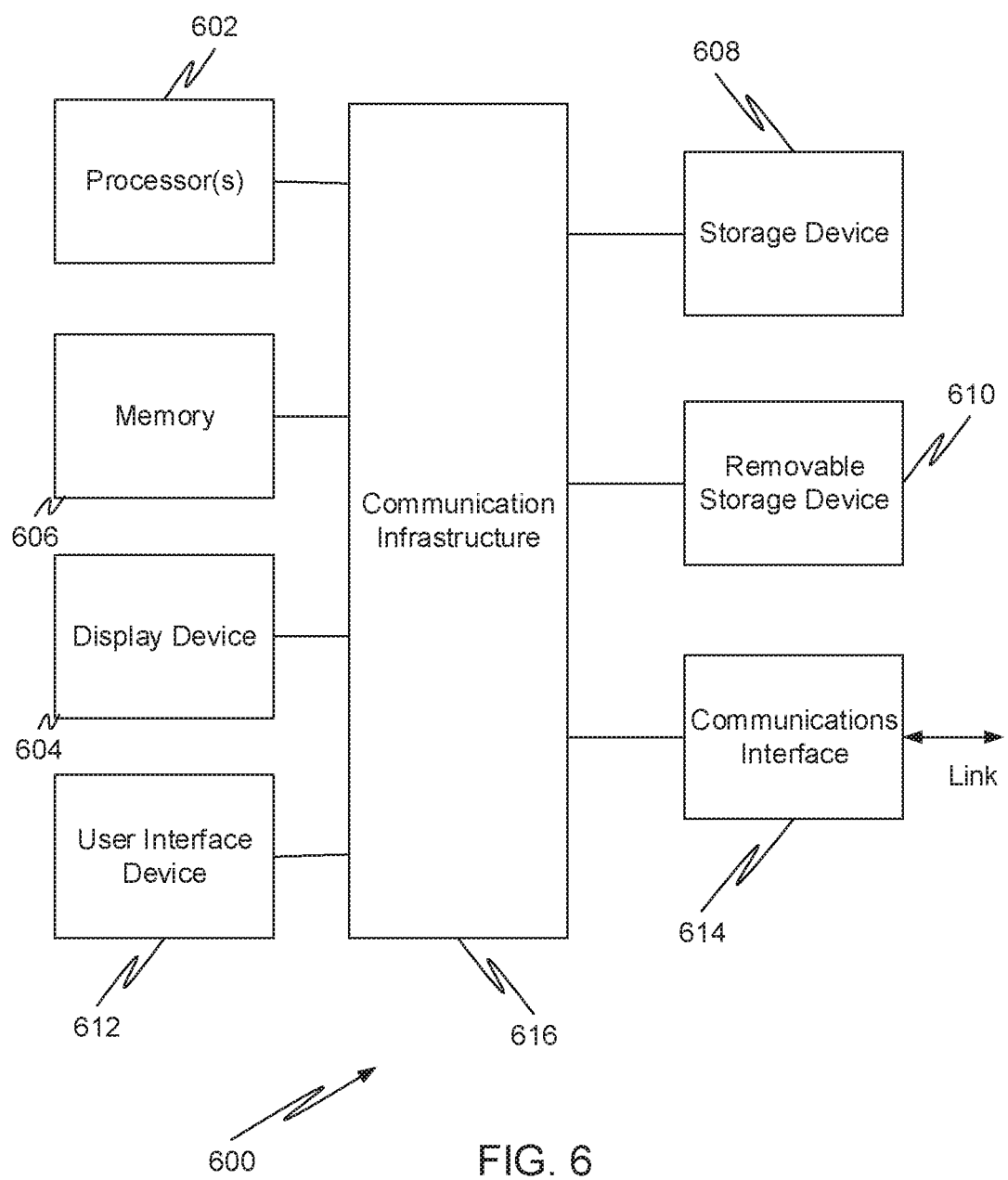
FIG. 6 is a schematic view of a computer system that may be used in practicing an embodiment.

FIG. 6 is a high level block diagram showing a computer system 600. The computer system 600 is suitable for implementing a controller 524 used in embodiments. The computer system may have many physical forms ranging from an integrated circuit, a printed circuit board, and a small handheld device, up to a huge super computer. The computer system 600 includes one or more processors 602, and further can include an electronic display device 604 (for displaying graphics, text, and other data), a main memory 606 (e.g., random access memory (RAM)), storage device 608 (e.g., hard disk drive), removable storage device 610 (e.g., optical disk drive), user interface devices 612 (e.g., keyboards, touch screens, keypads, mice or other pointing devices, etc.), and a communication interface 614 (e.g., wireless network interface). The communication interface 614 allows software and data to be transferred between the computer system 600 and external devices via a link. The system may also include a communications infrastructure 616 (e.g., a communications bus, cross-over bar, or network) connected to the aforementioned devices/modules.

Information transferred via communications interface 614 may be in the form of signals such as electronic, electromagnetic, optical, or other signals capable of being received by communications interface 614, via a communication link that carries signals and may be implemented using wire or cable, fiber optics, a phone line, a cellular phone link, a radio frequency link, and/or other communication channels. With such a communications interface, it is contemplated that the one or more processors 602 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Figure 7:
FIG. 7 is a schematic cross-sectional view of part of an electrostatic chuck (ESC) with a silicon oxide based coating formed according to the embodiment shown in FIG. 4.

FIG. 7 is a schematic cross-sectional view of part of an ESC 704 with a silicon oxide based coating formed according to the embodiment shown in FIG. 4. The silicon oxide based coating comprises a first layer 708 and a second layer 712. The first layer 708 is the part of the silicon oxide based coating that was not changed by the oxygen burn. The second layer 712 is the part of the silicon oxide base coating that was changed by the oxygen burn. As mentioned above, it has been found that the second layer 712 is more robust than the first layer 708. In addition, it has been found that using the oxygen burn to provide a toughened second layer 712 reduces sticking between a wafer and the ESC 704. Wafer sticking to the ESC 704 is a problem for high temperature processes. Wafer sticking may result in high dynamic alignment offset errors. Therefore, the use of an oxygen burn reduces particle/defect levels and dynamic alignment offset errors.

While this disclosure has been described in terms of several embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for conditioning a plasma processing chamber including a chuck, the method comprising a plurality of cycles, wherein each cycle comprises:

cleaning an interior of the plasma processing chamber and the chuck;

forming a silicon oxide based coating on the interior of the plasma processing chamber and the chuck, the silicon oxide based coating having a first silicon oxide based layer and a second silicon oxide based layer, wherein the forming the silicon oxide based coating comprises:

depositing an initial silicon oxide based coating on the interior of the plasma processing chamber and on the chuck; and providing an oxygen based burn of the initial silicon oxide based coating to form the initial silicon oxide based coating into the first silicon oxide based layer of the silicon oxide based coating not changed by the oxygen based burn and the second silicon oxide based layer of the silicon oxide based coating changed by the oxygen based burn wherein the first silicon oxide based layer is between the second silicon oxide based layer and the plasma processing chamber, wherein the providing the oxygen based burn comprises:

providing a burn gas comprising oxygen; and transforming the burn gas into a plasma;

placing a substrate in the plasma processing chamber after forming the silicon oxide based coating;

plasma processing the substrate in the plasma processing chamber, wherein the silicon oxide based coating protects the interior of the plasma processing chamber and the chuck during the plasma processing of the substrate; and removing the substrate from the plasma processing chamber.

2. The method, as recited in claim 1, wherein the oxygen based burn forms the second silicon oxide based layer of the silicon oxide based coating to be more uniform than the first silicon oxide based coating.

3. The method, as recited in claim 1, wherein the providing the oxygen based burn further comprises providing a bias of less than 400 volts.

4. The method, as recited in claim 1, wherein the cleaning of the interior of the plasma processing chamber and the chuck is a waferless cleaning, the waferless cleaning comprising:

providing a cleaning gas; and transforming the cleaning gas into a plasma, wherein the plasma removes residue on the interior of the plasma processing chamber and on the chuck.

* * * * *